United States Patent [19]

Aigoo

[11] Patent Number: 4,486,945
[45] Date of Patent: Dec. 11, 1984

[54] METHOD OF MANUFACTURING SEMICONDUCTOR DEVICE WITH PLATED BUMP

[76] Inventor: Seiichiro Aigoo, 15-13, Negishi 3-chome, Taito-Ku, Tokyo 110, Japan

[21] Appl. No.: 456,081
[22] PCT Filed: Apr. 21, 1981
[86] PCT No.: PCT/JP81/00093
§ 371 Date: Dec. 16, 1982
§ 102(e) Date: Dec. 16, 1982
[87] PCT Pub. No.: WO82/03727
PCT Pub. Date: Oct. 28, 1982
[51] Int. Cl.³ ............... H01L 21/28; H01L 21/44; H01L 23/28; H01L 29/40
[52] U.S. Cl. ............... 29/588; 29/591; 357/71; 357/72; 357/73; 174/52 PE; 174/52 FP
[58] Field of Search ............... 29/588, 589, 591, 571; 148/1.5; 357/71, 70, 73, 76, 72; 174/52 PE, 52 S, 52 FP

[56] References Cited

U.S. PATENT DOCUMENTS

| | | | |
|---|---|---|---|
| 3,392,442 | 7/1968 | Napier et al. | 357/71 X |
| 3,508,118 | 4/1970 | Merrin et al. | 357/71 X |
| 3,663,184 | 5/1972 | Wood et al. | 357/71 X |
| 3,761,309 | 9/1973 | Schmitter et al. | 357/71 X |
| 3,981,074 | 9/1976 | Yamamoto et al. | 174/52 FP X |
| 4,005,472 | 1/1977 | Harris et al. | 357/71 |
| 4,065,588 | 12/1977 | Arnold | 29/589 X |
| 4,065,625 | 12/1977 | Iwai et al. | 174/52 EP X |
| 4,229,758 | 10/1980 | Ikari | 174/52 FP X |
| 4,303,934 | 12/1981 | Stitt | 174/52 FP X |

Primary Examiner—Brian E. Hearn
Assistant Examiner—David A. Hey
Attorney, Agent, or Firm—Martin A. Farber

[57] ABSTRACT

This invention relates to a method for manufacturing a resin molded semiconductor device. According to the manufacturing method of this invention, at first an insulation film with openings at bump formed positions is applied on a semiconductor wafer having aluminium wiring thereon, then a plating ground metal layer is formed on the insulation film, then a photo resist layer with openings at bump formed positions is masked over the plating ground metal layer, then an easily bonded metal with drawing out leads such as a wire is plated at bump formed positions on the plating ground metal layer to form bumps, then the photo resist layer and the plating ground metal layer locating at those positions other than bump formed positions are removed to complete a semiconductor chip, then the semiconductor chip is bonded to a lead frame or a circuit substrate, then the drawing out leads such as a wire are bonded to the bumps on the semiconductor chip to complete a semiconductor bump chip, and finally the semiconductor bump chip is passivation-treated using passivation glass. Furthermore, a photo resist layer with openings at bump formed positions may be masked over the insulation film prior to forming the plating ground metal layer.

18 Claims, 7 Drawing Figures

METHOD OF MANUFACTURING SEMICONDUCTOR DEVICE WITH PLATED BUMP

DESCRIPTION

1. Technical Field

This invention relates to a resin-molded semiconductor device used for electric circuits, and more particularly, to a semiconductor device with plated bumps having a sealing structure which can prevent an external environment atmosphere from invading through the contact surfaces with a resin mold at the lead drawing out portions thereof.

2. Background Art

In the field of semiconductor devices, according to a well known prior method for drawing out leads from active and passive elements in a semiconductor chip to the exterior, aluminium is first evaporated on the surface of the chip to form internal wiring and bonding regions. Each such lead such as a wire, is bonded to a lead frame or a circuit substrate by ultrasonic bonding, thermo compression bonding or other techniques, and then a resin mold is formed around the chip to enclose and complete the semiconductor device.

More specifically, when manufacturing a DIP type resin-molded semiconductor device as shown in FIG. 1, an oxide film 4 is formed on a semiconductor chip 1 with a collector region 12 and a base region 3. An aluminium layer 5 is applied thereon to form internal wiring and bonding regions, as shown in FIG. 3. Then, a passivation film 6 is coated thereover to protect the overall surface, except for the aluminium bonding regions. That portion of the aluminium layer 5 serving as bonding pads is connected to a lead frame 8 or to a circuit substrate using drawing out leads such as a wire 7. A resin mold 9 is formed around the chip to obtain the complete semiconductor device.

In a semiconductor device arranged as above, however, the aluminium bonding pad 5 to which the drawing out lead such as the wire 7 is connected has size of 80~150 μm square, while the wire 7 has a thickness of 25~30 μm in diameter. Therefore, the semiconductor device is sealed by the resin mold 9 such that the aluminium surface of the pad 5 is exposed, at least at positions other than the connected portion of the wire 7 to the aluminium bonding pad 5. In this manner, even if the lead frame 8, wire 7 and semiconductor chip 1 have been sealed by the resin mold 9, there will appear gaps with age at the sealing contact surface with the resin depending on environmental conditions such as temperature, moisture or various gases, to which the semiconductor device will be subjected, thereby resulting in a partially unsealed state. When moisture or various gases enter along the lead frame 8 and wire 7 from these gaps and reach the aluminium bonding pad 5, "purple plague" phenomenon will occur in the bonding pad where the aluminium surface is exposed, and this may cause breaking of the semiconductor device. Furthermore, another drawback also has been experienced such that although the surface of the semiconductor chip 1 is protected by the passivation film 6, for example an oxide film, phosphorous glass film or nitride film, the film itself is very thin and often includes pin holes therein, whereby moisture or gas having entered therethrough causes insulation breakdown on the surface of the semiconductor chip at locations other than at the bonding pad.

It is therefore an object of this invention to provide a method of manufacturing a semiconductor device in which such purple plague phenomenon or insulation breakdown will not occur, and which method can be easily applied.

SUMMARY OF THE INVENTION

A method of manufacturing a semiconductor device with plated bumps according to this invention comprises a first step in which an insulation film with openings at bump formed positions is applied on a semiconductor wafer having aluminium wiring thereon, a second step in which a plating ground metal layer is formed on the insulation film, a third step in which a photo resist layer with openings at bump formed positions is masked over the plating ground metal layer, a fourth step in which an easily bonded metal with drawing out leads such as a wire is plated at bump formed positions on the plating ground metal layer to form bumps, a fifth step in which the photo resist layer and the plating ground metal layer located at those positions other than the bump formed positions are removed to complete a semiconductor chip, a sixth step in which the semiconductor chip is bonded to a connecting device, such as lead frame or a circuit substrate, a seventh step in which the drawing out leads such as a wire are bonded to the bumps on the semiconductor chip to complete a semiconductor bump chip, and an eighth step in which the semiconductor bump chip is passivation-treated using passivation glass. In the semiconductor device made by the manufacturing method according to this invention, the bumps to be led out to the exterior for energizing are fully covered with the plating ground metal on the surface which includes the aluminium wiring, so that purple plague phenomenon will not occur. Also, even when an easily oxidizable metal is used for the plating ground metal, conduction breakdown will not occur because of passivation treatment, and, furthermore, insulation breakdown will not occur due to the surface of the semiconductor chip being passivation-treated. Furthermore, when prior art semiconductor chips with plated bumps are handled or operated upon, the wire loops, after being bonded, are prone to contact with each other, to suffer edge touching, or to suffer a twist failure. These problems can arise from bad connection with the lead frame, instability of resin mold technique applied after loading the chip on the circuit substrate, and failure of the resin mold itself. In the manufacturing method of the present invention, however, the passivation treatment is carried out after wire bonding, so that reduction in yield can be avoided irrespective of instability of the resin mold. Therefore, semiconductor devices with high reliability can be obtained.

In addition, this invention may include a ninth step prior to the second step mentioned above, in which a photo resist layer with openings at bump formed positions is masked over the foregoing insulation film. In this case, the plating ground metal layer to be applied in the second step is first formed on the photo resist layer masked in the ninth step.

BRIEF DESCRIPTION OF DRAWINGS

With the above and other objects and advantages in view, the present invention will become more clearly understood in connection with the detailed description of a preferred embodiment, when considered with the accompanying drawings, of which:

FIGS. 4 ~7 are views showing processes of a manufacturing method according to this invention; in which FIG. 4 is a partial sectional view of a semiconductor chip in the state where bump plating has been completed;

FIG. 5 is a partial sectional view of a semiconductor bump chip in the state where wire bonding has been completed;

FIG. 6 is a partial sectional view of the completed semiconductor device; and

FIG. 7 is a sectional view showing the entire completed semiconductor device of FIG. 6.

DETAILED DESCRIPTION OF THE PREFERRED PROCESS OF THE INVENTION

Figure 1:
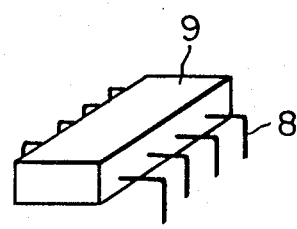
FIG. 1 is a perspective view of a completed mold type semiconductor device.
Figure 2:
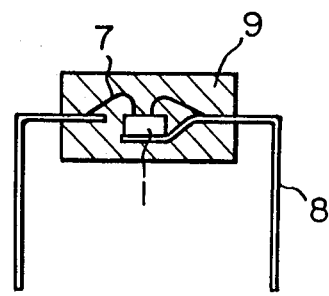
FIG. 2 is a sectional pictorial view of the prior art mold type semiconductor device.
Figure 3:
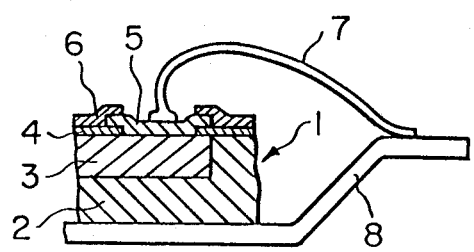
FIG. 3 is a partially enlarged view of the mold type semiconductor device shown in FIG. 2.

The present method for manufacturing a semiconductor device with plated bumps is shown in FIGS. 4, 5, 6 and 7. Accordingly, semiconductor chip 21 comprises not only a collector region 22 and a base region 23 but also an oxide film 24 and an aluminium layer 25. Aluminium layer 25 functions as wiring and is located at elevated, or bump formed, positions in the chip. An insulation layer, or film, 26 is applied on the aluminium layer 25 by vapor growth, evaporation, sputtering or other suitable techniques. Insulation film 26 comprises silicon oxide ($SiO_2$), for example, and has a thickness of $2\mu \sim 3\mu$. After applying the insulation film 26, the film 26 is photo etched to make openings at the above bump formed positions.

Then, a plating ground metal layer 27 is applied over the aluminium layer 25 and insulation film 26. Regarding this plating ground metal, it is required to use such metals that produce a strong adhesion force with the aluminium layer 25 and insulation film 26, that have relatively small oxide generation energy, and that are easily bonded to the bump forming plated layer mentioned later below. Chromium (Cr), copper (Cu) or gold (Au) can be used as the plating ground metal meet such conditions. The plating ground metal layer 27 is applied over the wafer surface such that the layer 27 now comprises bonding pads together with the bump forming plated layer. The plating ground metal layer 27 is applied by evaporation or sputtering and has a thickness of 5000 Å~8000 Å depending on the grades of completed devices.

Then, to allow partial bump plating, a photo resist 28 is coated on the plating ground metal layer 27 in a thickness of about $2\mu$ and openings are made at bump formed positions in the photo resist 28 by pattern treatment.

Figure 4:
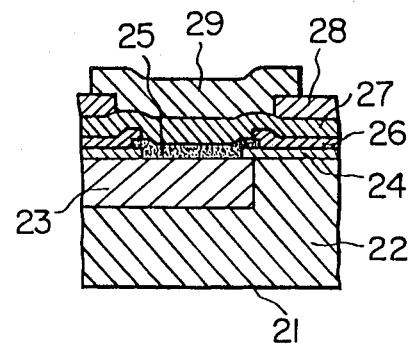

Then, a bump forming plated layer 29 is applied at the bump formed positions. The bump plating is carried out utilizing non-cyanic gold plating bath, but other materials may be substituted for non-cyanic gold. Thickness of the plated layer is in a range of $5\mu \sim 25\mu$ and is optional according to the purpose of the completed semiconductor devices. When using non-cyanic gold plating bath, about 4 minutes is required for developing the plated layer of $1\mu$, in a normal plating velocity and typical current density of 4 mA/cm². FIG. 4 shows the semiconductor chip in the state where the forgoing processes have been completed.

Figure 5:
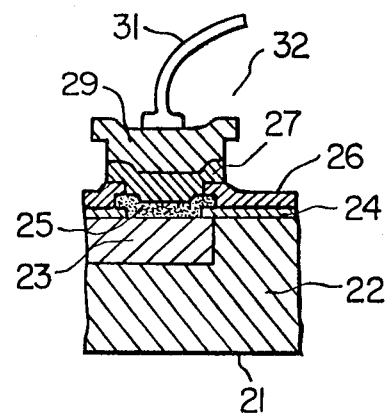

Then, the photo resist 28, coated for bump plating, is lifted off and the rest of the plating ground layer 27 is also removed except for leaving that part of layer 27 located at those bump formed positions necessary for the aluminium layer 25 and bump-forming plated layer 29 to be closely bonded to the insulation film 26 and to be energized. Thereafter, a wire 31 is connected to the bump forming plated layer 29. At the end of this process, the semiconductor chip 32 as shown in FIG. 5. is completed.

Then, after bonding the semiconductor chip 32 to a lead frame 33, the semiconductor chip 32 is electrically connected with the lead frame 33 through the wire 31 for energizing, so that a semiconductor bump chip 34 is completed.

Then, for the purpose of passivation, passivation glass is vaporized by vacuum evaporation, vacuum sputtering or laser beam sputtering and then deposited over the semiconductor bump chip 34 so as to form a deposition film 35. Thickness of the deposition film is suitable in a range of 5000 Å~50000 Å, and may be optional depending on the variety of semiconductor device under consideration.

Figure 6:
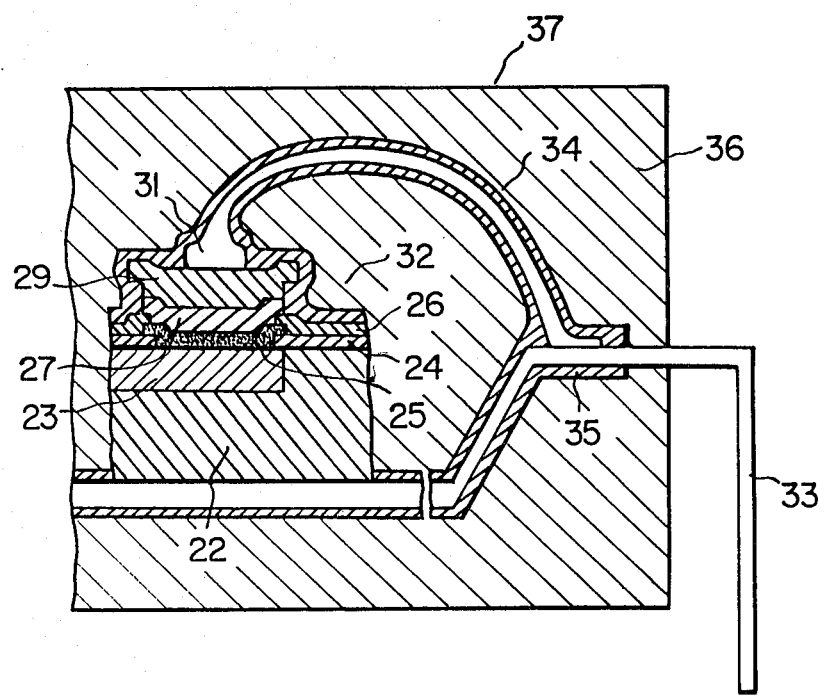
Figure 7:
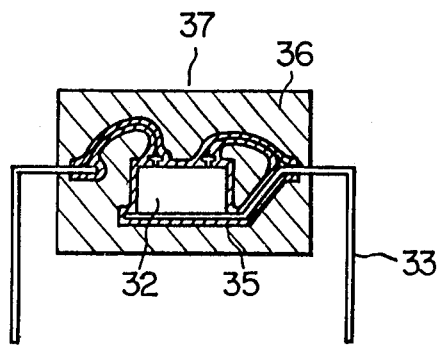

Finally, the whole chip is molded by sealing resin to form a resin molded layer 36, so that a semiconductor device with plated bumps 37 is completed. FIGS. 6 and 7 show the DIP type resin molded semiconductor device with plated bumps which has been manufactured in such a manner.

In addition, when utilizing a resist lifting off method, the chip is pattern-treated by using the photo resist coat identical to the foregoing photo resist 28 after forming the insulation film 26 and prior to applying the plating ground metal layer 27 as mentioned above.

Besides, although the wire 31 is used as the drawing out leads in the above description by way of example, the wire 31 may be replaced by other type leads such as a drawing out lead formed by etching or punching.

As described in the above, the semiconductor device with plated bumps made by the manufacturing method according to this invention has a better seal than prior art devices and thus can be effectively used for electric circuits that will be subjected to a stressful environment containing moisture or harmful gas.

What is claimed is:

1. A method of manufacturing a semiconductor device with plated bumps, the steps comprising:
    a first step in which an insulation film with openings at bump formed positions is applied on a semiconductor wafer having aluminium wiring thereon,
    a second step in which a plating ground metal layer is formed on said insulation film,
    a third step in which a photo resist layer with openings at the bump formed positions is masked over said plating ground metal layer,
    a fourth step in which a metal which is easily bondable with drawn out leads is plated at the bump formed positions on said plating ground metal layer to form bumps,
    a fifth step in which said photo resist layer and said plating ground metal layer located at those positions other than the bump formed positions are removed to complete a semiconductor chip,
    a sixth step in which drawn out leads are bonded to said bumps on said semiconductor chip to complete a semiconductor bump chip, a seventh step in which said semiconductor bump chip is bonded to a connecting device, an eighth step in which said semiconductor bump chip and the part of the connecting device to which it is bonded is passivation-treated using passivation glass.

2. A method of manufacturing a semiconductor device with plated bumps according to claim 1, further comprising, prior to said second step, performing a ninth step in which a photo resist layer with openings at bump formed positions is masked over said insulation film, and wherein said plating ground metal layer to be applied in said second step is first formed on said photo resist layer masked in said ninth step.

3. A method of manufacturing a semiconductor device with plated bumps according to claim 1, wherein forming in the eighth step, before a subsequent resin molding step, a passivation deposition film in the range of 5,000 Å to 50,000 Å on the semiconductor bump chip and the part of the connecting device to which it is bonded.

4. A method of manufacturing a semiconductor device with plated bumps according to claim 3, further comprising performing a ninth step of resin molding molding the entire semiconductor bump chip and the part of the connecting device to which it is bonded with sealing resin after the eighth step.

5. A method of manufacturing a semiconductor device with plated bumps according to claim 1, further comprising performing a ninth step of resin molding molding the entire semiconductor bump chip and the part of the connecting device to which it is bonded with sealing resin after the eighth step.

6. A method of manufacturing a semiconductor device with plated bumps according to claim 1, wherein said eight step is performed by vaporizing the passivation glass by vacuum evaporation and depositing the vaporized passivation glass over the semiconductor bump chip.

7. A method of manufacturing a semiconductor device with plated bumps according to claim 1, wherein said eight step is performed by vaporizing the passivation glass by laser beam sputtering and then depositing the vaporized passivation glass over the semiconductor bump chip.

8. A method of manufacturing a semiconductor device with plated bumps according to claim 1, wherein said eight step is performed by vaporizing the passivation glass by vacuum sputtering and then depositing the vaporized passivation glass over the semiconductor bump chip.

9. A method of manufacturing a semiconductor device with plated bumps according to claim 1, wherein the connecting device is a lead frame.

10. A method of manufacturing a semiconductor device with plated bumps according to claim 1, wherein the connecting device is a circuit substrate.

11. A method of manufacturing a semiconductor device with plated bumps according to claim 1, wherein between said seventh and eighth steps said drawn out leads are electrically connected to said connecting device.

12. A method of manufacturing a semiconductor device with plated bumps according to claim 1, wherein said drawn out leads are wire.

13. A method of manufacturing a semiconductor device with plated bumps according to claim 1, wherein the bonding of the drawn out leads in the sixth step is formed by etching.

14. A method of manufacturing a semiconductor device with plated bumps according to claim 1, wherein the bonding of the drawn out leads in the sixth step is formed by punching.

15. A method of manufacturing a semiconductor device with plated bumps, the steps comprising:

a first step in which an insulation film with openings at bump formed positions is applied on a semiconductor wafer having aluminum wiring thereon, a second step in which a plating ground metal layer is formed on said insulation film, a third step in which a photo resist layer with openings at the bump formed positions is masked over said plating ground metal layer, a fourth step in which a metal which is easily bondable with drawn out leads is plated at the bump formed positions on said plating ground metal layer to form bumps, a fifth step in which said photo resist layer and said plating ground metal layer located at those positions other than the bump formed positions are removed to complete a semiconductor chip, a sixth step in which said semiconductor chip is bonded to a lead frame or a circuit substrate, a seventh step in which drawn out leads are bonded to said bumps on said semiconductor chip to complete a semiconductor bump chip, an eighth step in which said semiconductor bump chip is passivation-treated using passivation glass.

16. A method of manufacturing a semiconductor device with plated bumps according to claim 15, wherein forming in the eighth step, before a subsequent resin molding step, a passivation deposition film in the range of 5,000 Å to 50,000 Å on the semiconductor bump chip.

17. A method of manufacturing a semiconductor device with plated bumps according to claim 15, wherein the bonding of the drawn out leads in the sixth step is formed by etching.

18. A method of manufacturing a semiconductor device with plated bumps according to claim 1, wherein the bonding of the drawn out leads in the sixth step is formed by punching.

* * * * *